(12) United States Patent
Neyra et al.

(10) Patent No.: US 11,770,071 B2
(45) Date of Patent: Sep. 26, 2023

(54) DYNAMIC ENHANCEMENT OF LOOP RESPONSE UPON RECOVERY FROM FAULT CONDITIONS

(71) Applicant: NXP USA, INC., Austin, TX (US)

(72) Inventors: Percy Edgard Neyra, Chandler, AZ (US); John Ryan Goodfellow, Mesa, AZ (US); Ondrej Pauk, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/350,119

(22) Filed: Jun. 17, 2021

(65) Prior Publication Data

US 2021/0313882 A1    Oct. 7, 2021

Related U.S. Application Data

(63) Continuation of application No. 16/459,542, filed on Jul. 1, 2019, now Pat. No. 11,050,347.

(51) Int. Cl.
*H02M 3/156* (2006.01)
*H02M 1/32* (2007.01)
*H03K 7/08* (2006.01)
*H02M 1/00* (2006.01)

(52) U.S. Cl.
CPC .............. *H02M 3/156* (2013.01); *H02M 1/32* (2013.01); *H02M 1/0012* (2021.05); *H02M 1/0025* (2021.05); *H02M 1/325* (2021.05); *H02M 3/1566* (2021.05); *H03K 7/08* (2013.01)

(58) Field of Classification Search
CPC .......... H02M 3/156; H02M 1/32; H02M 1/36; H02M 3/1566; H02M 1/325; H02M 1/0025
See application file for complete search history.

(56) References Cited

U.S. PATENT DOCUMENTS 10,180,695 B1    1/2019  Bikulcius
11,050,347 B2 *  6/2021  Neyra ................... H02M 3/156

* cited by examiner

*Primary Examiner* — Rafael O De Leon Domenech

(57) ABSTRACT

A method for dynamic enhancement of loop response upon recovery from fault conditions includes detecting a fault condition in response to a programmed output voltage of a Pulse Width Modulation (PWM) converter decreasing below an input voltage of the PWM converter. A peak voltage is sampled at the end of at least one of a plurality of clock cycles of the PWM converter in response to detecting the fault condition, wherein the peak voltage is proportional to a sensed current conducted through a transistor. An error output of an error amplifier is preset to an error value determined by the peak voltage. A PWM driver is controlled with the error value to drive the transistor. An output load is charged to the programmed output voltage with the transistor in response to the input voltage increasing above the programmed output voltage.

22 Claims, 8 Drawing Sheets

DYNAMIC ENHANCEMENT OF LOOP RESPONSE UPON RECOVERY FROM FAULT CONDITIONS

This application is a continuation of U.S. patent application Ser. No. 16/459,542, having a filing date of Jul. 1, 2019, entitled "Dynamic Enhancement of Loop Response Upon Recovery From Fault Conditions," and having a common assignee, all of which is incorporated by reference in its entirety.

FIELD

This disclosure relates generally to Pulse Width Modulation (PWM) converters, and more specifically to enhancement of a loop response of a PWM converter in response to recovery from a fault condition.

BACKGROUND

Current mode PWM converters can enter various limit conditions outside of normal operation. The converter is often expected to enter and leave these limit conditions gracefully and preferably with either a predictable and controlled amount of disturbance, or no disturbance at all, at its output. These limit conditions can include dropout, current limit, and others, which cause saturation of one of the state variables of the converter.

A dropout condition is defined as the condition when the input voltage of the converter falls below its programmed output voltage. During a dropout condition, the duty cycle of the converter can become saturated to a 100% duty cycle. The dropout condition in turn causes other state variables, (or nodes), within its controller to become saturated. Recovery from saturation can be slow and therefore can induce undesirable large transients at the output of the converter.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for a method and apparatus to prevent an overshoot of an output of a PWM converter during recovery from a fault condition. The overshoot is prevented by predictively determining an error output level of an error amplifier to accelerate recovery from the fault condition. More particularly, the output of an error amplifier, which is prone to saturation during the fault condition, is dynamically preset to a state (e.g., a voltage level), closest to the state that the error amplifier would be in upon recovery from the fault condition. In one embodiment, the state is preset for each cycle of the PWM converter, during the existence of the fault condition, hence recovery from the fault does not depend on the length of time the PWM converter spends in the fault condition. The value of the state is dynamically determined from other conditions of a PWM power stage that are not prone to saturation during the fault condition.

Figure 1:
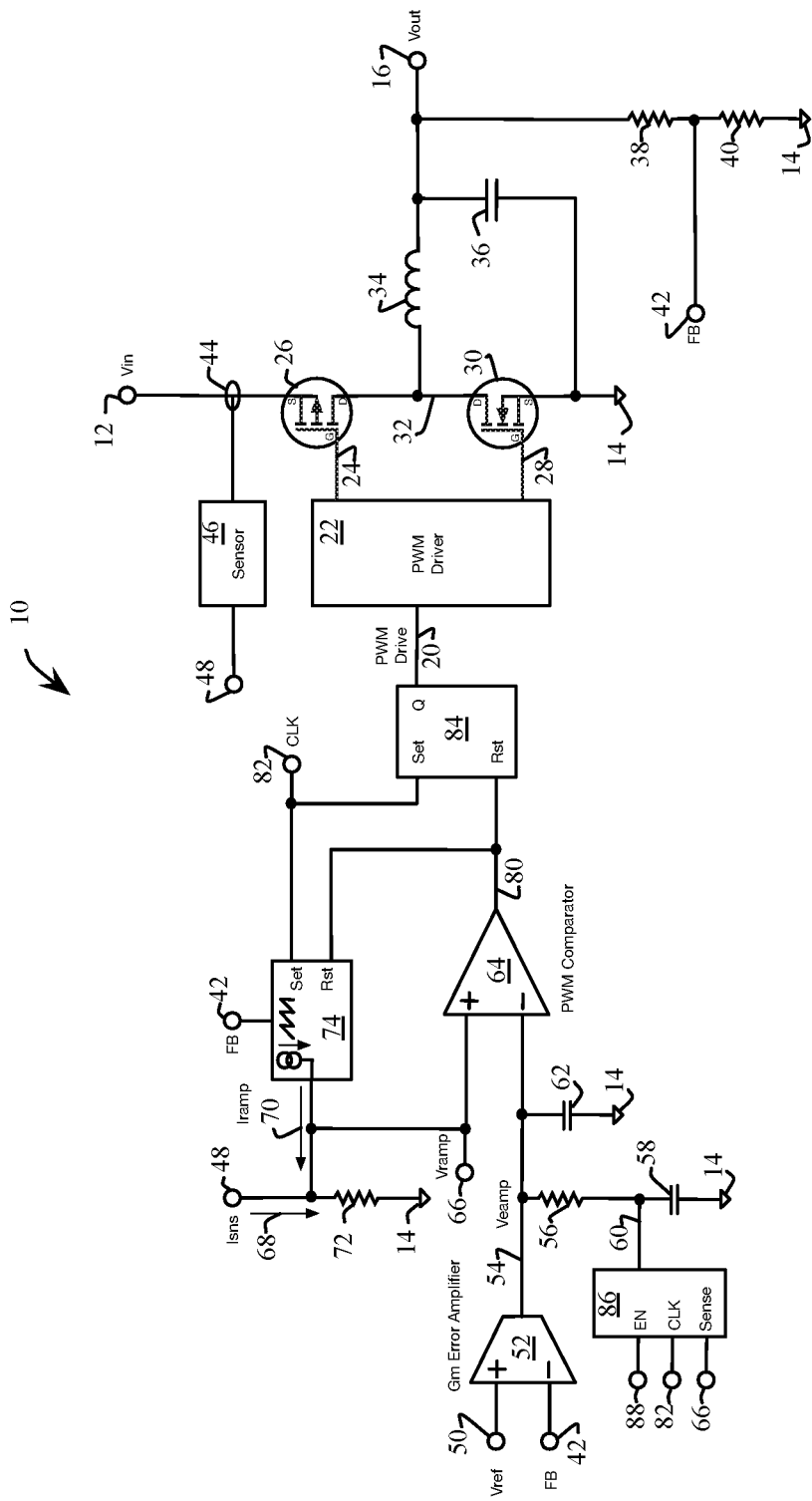
FIG. 1 is a schematic view of an example embodiment of a PWM converter.

FIG. 1 shows an example embodiment 10 of a PWM converter configured as a current mode buck converter. In the example embodiment 10, an input voltage (Vin) is driven on an input 12. The input voltage is referenced to a ground 14 and converted to an output voltage (Vout) on an output 16, by transferring a series of energy packets controlled by a PWM drive signal 20. The PWM drive signal 20 drives a PWM driver 22, which drives a P-channel Field Effect Transistor (PFET) gate 24 of a PFET 26 (e.g., a "high-side transistor"), thereby increasing the output voltage 16. The PWM driver also drives an N-channel Field Effect Transistor (NFET) gate 28 of an NFET 30 (e.g., a "low-side transistor"), thereby decreasing the output voltage.

The PFET 26 and the NFET 30 both connect to a node 32 where a current is either sourced or sunk through an inductor 34 connected between the node 32 and the output 16. A capacitor 36 is connected between the output 16 and the ground 14. The inductor 34 and the capacitor 36 form a load of the embodiment 10 of the PWM converter. A resistor 38 and a resistor 40 form a resistive divider, which determines an feedback voltage 42, used as part of a control loop of the PWM converter. A current detector 44 is used by a current sensor 46 to determine a current sensor output 48. In one example embodiment, the current detector 44 is one leg of a current mirror. In another example embodiment, the current detector 44 is a hall-effect sensor.

The feedback voltage 42 is compared against a reference voltage (Vref) 50 by an error amplifier 52 to determine an error output 54 (Veamp). In one example embodiment, the error amplifier 52 is an Operational Transconductance Amplifier (OTA). The error output 54 is applied across a compensation resistor 56 in series with a compensation capacitor 58. The compensation capacitor 58 is between a compensation node 60 and the ground 14. In one embodiment, the error output 54 is also applied across an additional capacitor 62 connected to the ground 14.

A PWM comparator 64 compares a ramp voltage (Vramp) 66 to the error voltage 54. A sensed current 68 (Isns) sourced from the current sensor output 48, and a ramp current (Tramp) 70 are combined through a sense resistor 72 to form the ramp voltage 66. The ramp current 70 is sourced from a ramp generator 74. The ramp generator 74 is controlled by the feedback voltage 42, an output 80 of the PWM comparator 64 and a clock 82, to determine the ramp duration and amplitude. The clock 82 sets a bistable device (e.g., a flip-flop) 84 to drive the PWM drive signal 20 high. The output 80 of the PWM comparator 64 resets the bistable device 84, to drive the PWM drive signal 20 low.

In one embodiment, a preset circuit 86 drives the compensation node 60, and thus presets the error output 54, to a voltage determined by a peak voltage of the PWM converter. In one embodiment, the peak voltage is determined by sampling a peak of the ramp voltage 66, occurring at the end of a clock cycle of the clock 82. In another embodiment, the peak voltage is determined by sampling a peak of the ramp voltage 66, occurring at the end of each clock cycle of the clock 82. The preset circuit 86 is activated by an enable signal 88, which is activated upon detection of a fault condition (e.g., a dropout condition or current limit condition).

A dropout condition in a buck converter is defined as the condition when the input voltage (Vin) to the converter falls below the programmed output voltage (Vout). A current mode converter as shown in FIG. 1 is expected to continue to operate during the dropout condition with the output of the converter closely tracking the input voltage. During the dropout condition, the error amplifier 52 becomes saturated. The error amplifier 52 is part of a control loop of the converter, thus extending a recovery time from the dropout condition. Saturation of the error amplifier occurs as a result of the feedback voltage 42 decreasing to a level that forces the error output 54 to a maximum level, thereby driving the output 80 of the PWM comparator 64 towards the ground voltage, preventing the bistable device 84 from being reset, and forcing the high-side transistor 26 to a 100% duty cycle (e.g., continuously in the "on" state).

Figure 2:
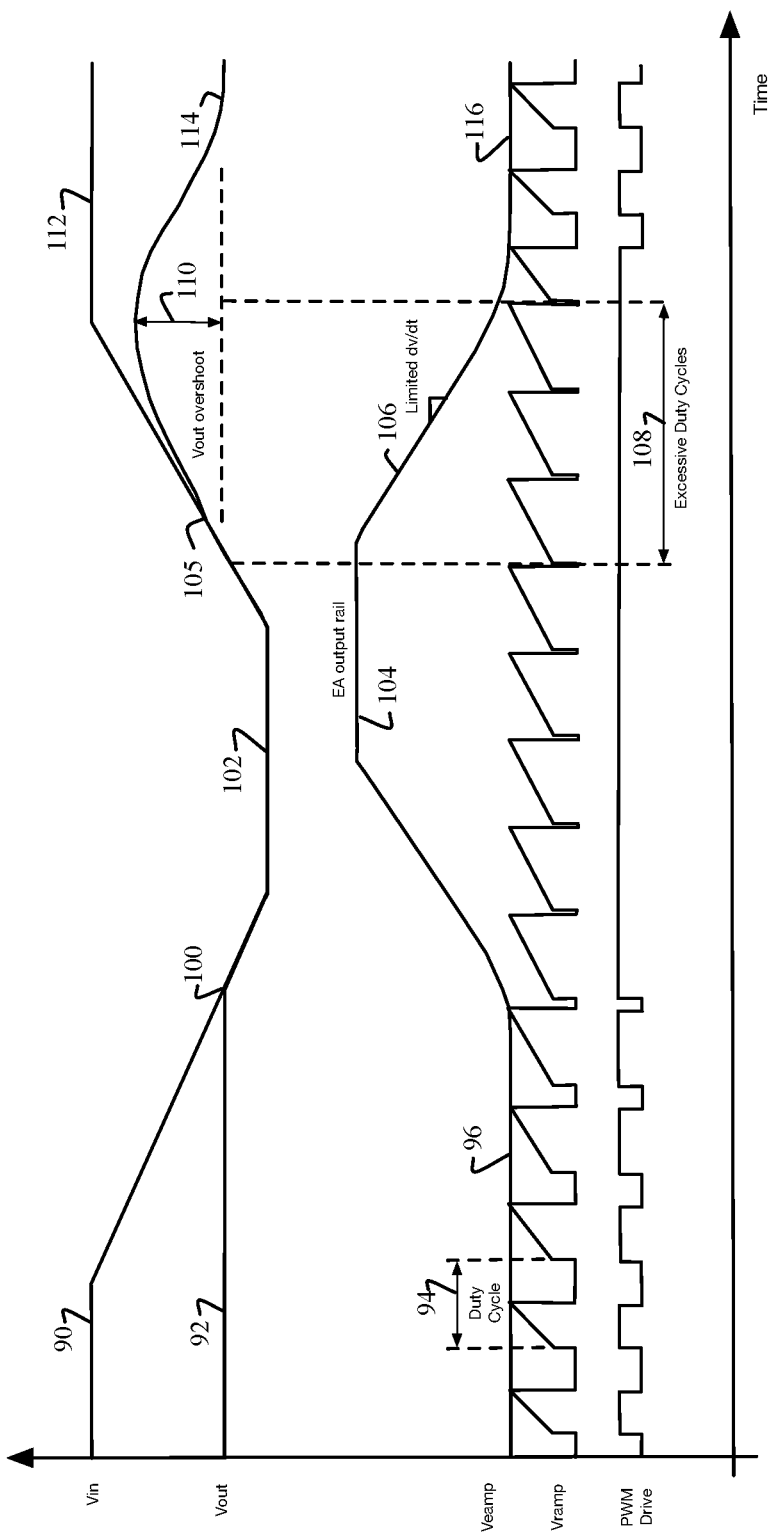
FIG. 2 is a graphical view of voltage waveforms of the example embodiment of FIG. 1 without dynamic enhancement of a loop response.

FIG. 2, with continued reference to FIG. 1, shows voltage waveforms without the benefit of dynamic enhancement of loop response. Example embodiments of the error amplifier 52 of FIG. 1 are implemented as an OTA with fixed Transconductance Gain (Gm), having a finite output current capability and high output impedance. Current mode buck converters are expected to return to normal operation when the dropout condition ends (e.g., the input voltage returns to a value above the programmed output voltage). If the input voltage rises rapidly over time (e.g., at high dv/dt), the output of the converter can significantly overshoot. Specifically, at time 90, the input voltage is above the output voltage at time 92, the duty cycle 94 of the PWM driver 22 is less than 100%, and the error output 54 is low at time 96 (e.g., the error amplifier 52 is not saturated). At time 100, the input voltage equals the output voltage, hence a further reduction in the input voltage would result in a dropout condition. As the input voltage continues to decrease below the programmed output voltage, the output voltage tracks the input voltage, as shown at time 102. The error amplifier 52 saturates as the feedback voltage 42 drops below the reference voltage 50, and the error output achieves a maximum value at time 104. At time 104, the duty cycle 94 is also maximized, thereby keeping the high-side transistor 26 in the "on" state and thereby allowing the output voltage to track the input voltage. The "programmed output voltage" is the desired output voltage, in contrast to the "output voltage," which is the actual voltage achieved at the output 16 of the converter.

At time 105, when the input voltage increases to the programmed output voltage, the error output 54 decreases, (or slews), at a slow rate due to the high impedance, and fixed Gm of the error amplifier 52. Thus, the error amplifier 52 slews the voltage on the compensation node 60 at a constant rate at time 106, insufficient to prevent excessive duty cycles during a time range 108. Accordingly, during the time range 108, the output voltage overshoots the programmed output voltage by an overshoot value 110. Eventually, the input voltage recovers to a high level at time 112, and the output voltage recovers to the programmed output voltage at time 114 when the error output at slewed down to a stable value at time 116. A similar behavior of the converter occurs during a current limit condition, as shown for the dropout condition.

Figure 3:
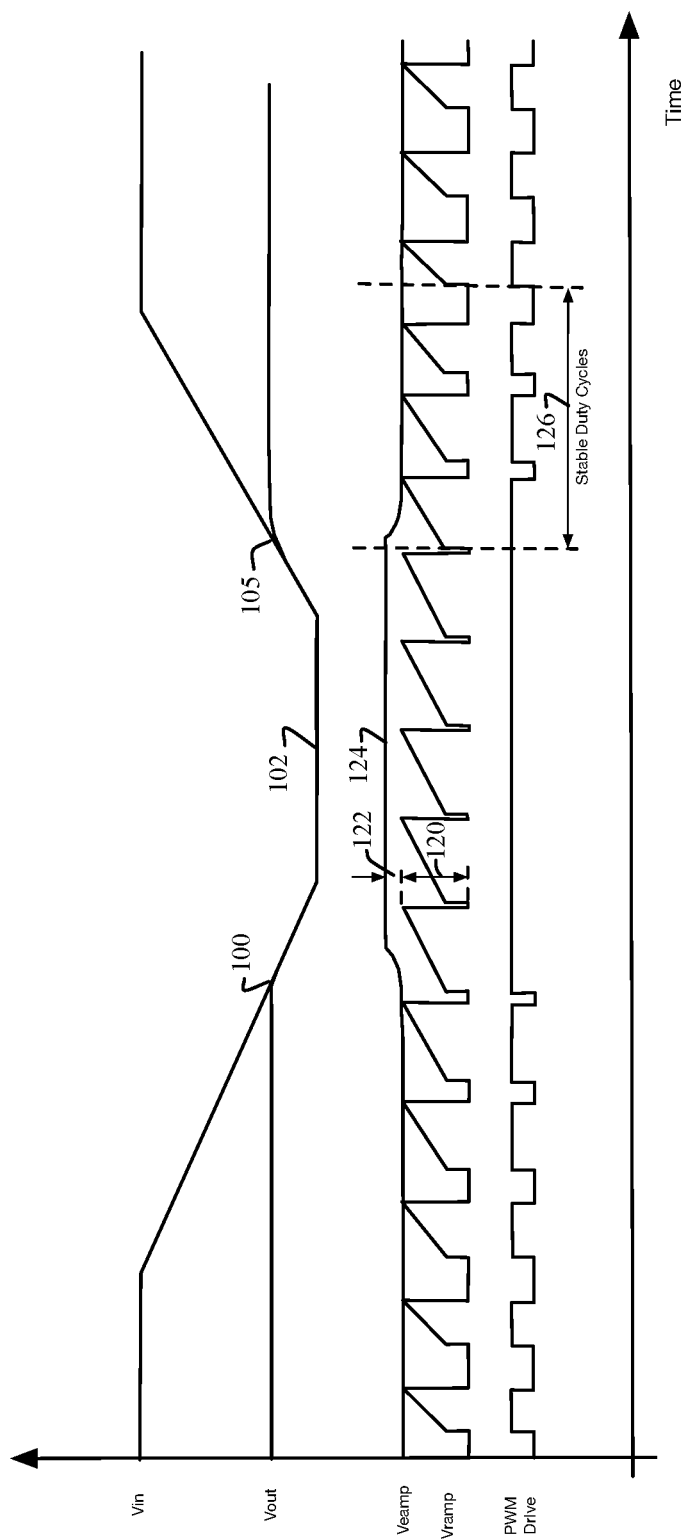
FIG. 3 is a graphical view of voltage waveforms of FIG. 1 with dynamic enhancement of the loop response in accordance with an example embodiment of the present disclosure.

In contrast to FIG. 2, FIG. 3 with reference to FIG. 1 shows voltage waveforms with the benefit of dynamic enhancement of loop response. In one embodiment, the ramp voltage 66 is sampled at the end of a clock cycle of the clock 82 by the preset circuit 86 to determine a peak voltage 120. The preset circuit 86 drives the compensation node 60 to the peak voltage 120, increased by a voltage offset 122. Accordingly, at time 124, the error amplifier 52 remains unsaturated and the duty cycles 126 remain at less than 100%.

Figure 4:
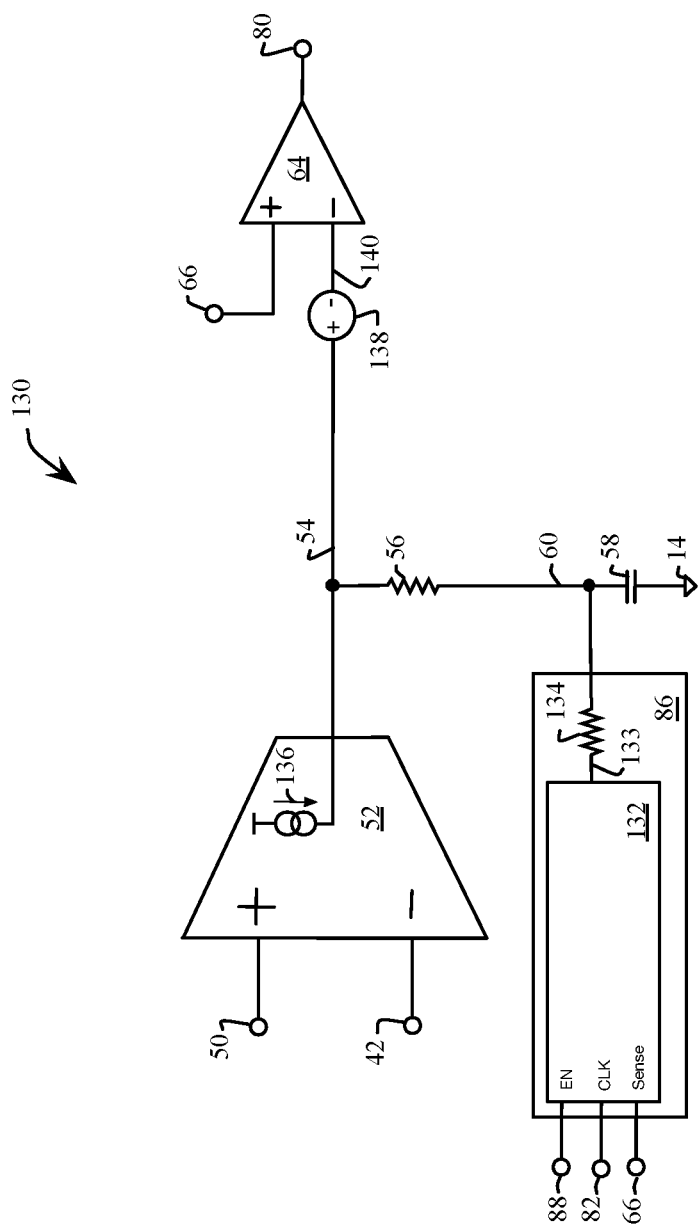
FIG. 4 is a schematic view of a preset circuit interfacing with elements of the example embodiment of FIG. 1 in accordance with an example embodiment of the present disclosure.

FIG. 4 shows an example embodiment 130 of the preset circuit 86 interfacing with elements of the embodiment 10 of FIG. 1. Referring to FIG. 1, FIG. 3 and FIG. 4, the preset circuit 86 samples the peak voltage 120 from the ramp voltage 66. The offset voltage 122 is formed by an offset resistor 134. Specifically, the error value (Veamp) on the error output 54 is forced to a value equal to the peak voltage 120, plus the bias current 136 of the error amplifier multiplied by a value of the compensation resistor 56 added to a value of the offset resistor 134. The bias current 136 is the maximum output current of the error amplifier 52. The peak voltage 120 is sampled by a sampling circuit 132 and applied to the offset resistor 134 at the output 133. In one embodiment, the offset voltage 122 exceeds an input referred offset 138 (shown symbolically at the input 140) of the PWM comparator 64. The offset voltage 122 is important to avoid switching the PWM comparator 64 during a dropout condition. Typically, the input referred offset 138 of the PWM comparator 64 is small, so that the voltage offset 122 has a negligible effect on the output voltage of the PWM converter upon exit from the dropout condition.

Figure 5:
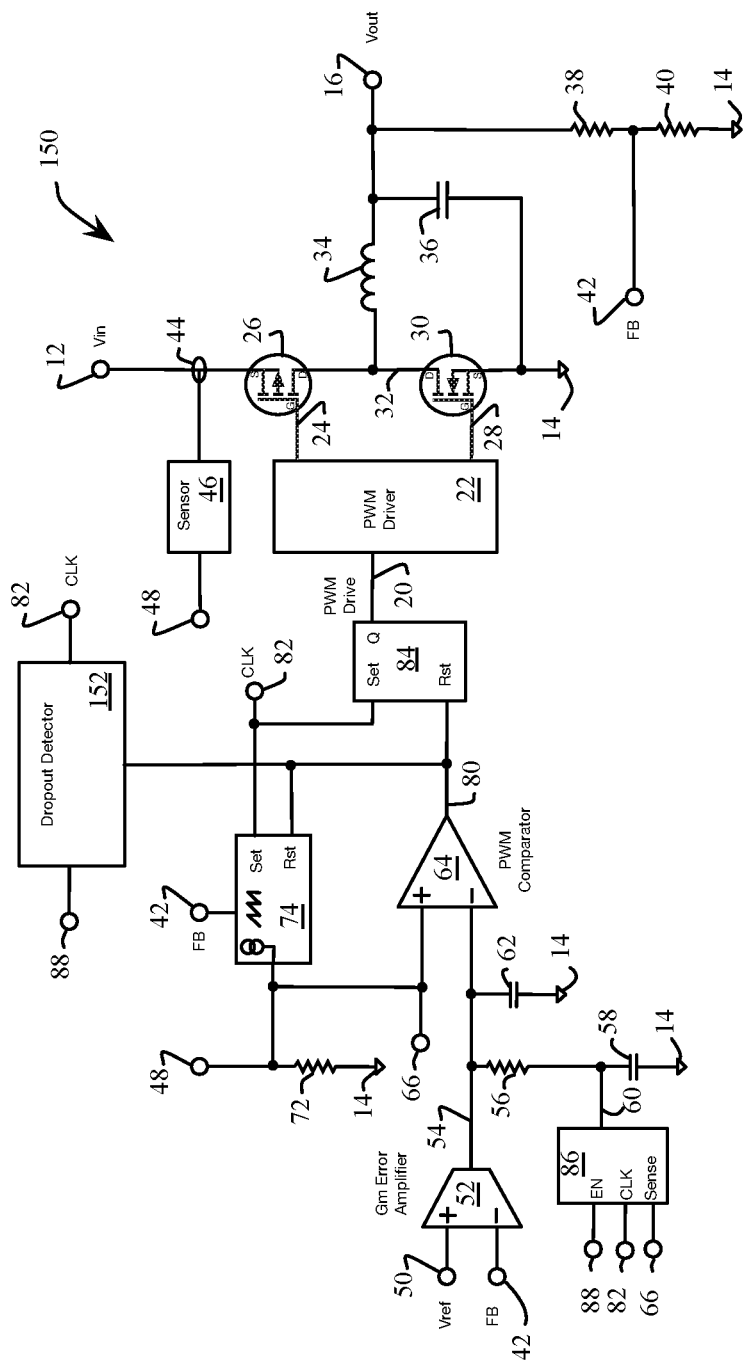
FIG. 5 is a schematic view of a PWM converter with a preset circuit for recovering from a dropout fault, in accordance with an example embodiment of the present disclosure.

FIG. 5 shows an example embodiment 150 configured to respond to a dropout condition of the PWM converter. A dropout detector 152 asserts an enable signal 88, when the PWM comparator remains low for a predefined period of time, corresponding to the dropout condition. In another embodiment, the enable signal 88 is determined by comparing an input of the error amplifier to a threshold value. For example, the enable signal 88 is asserted when the feedback voltage 42 drops below the reference voltage 50 as determined by a comparator with hysteresis.

Figure 6:
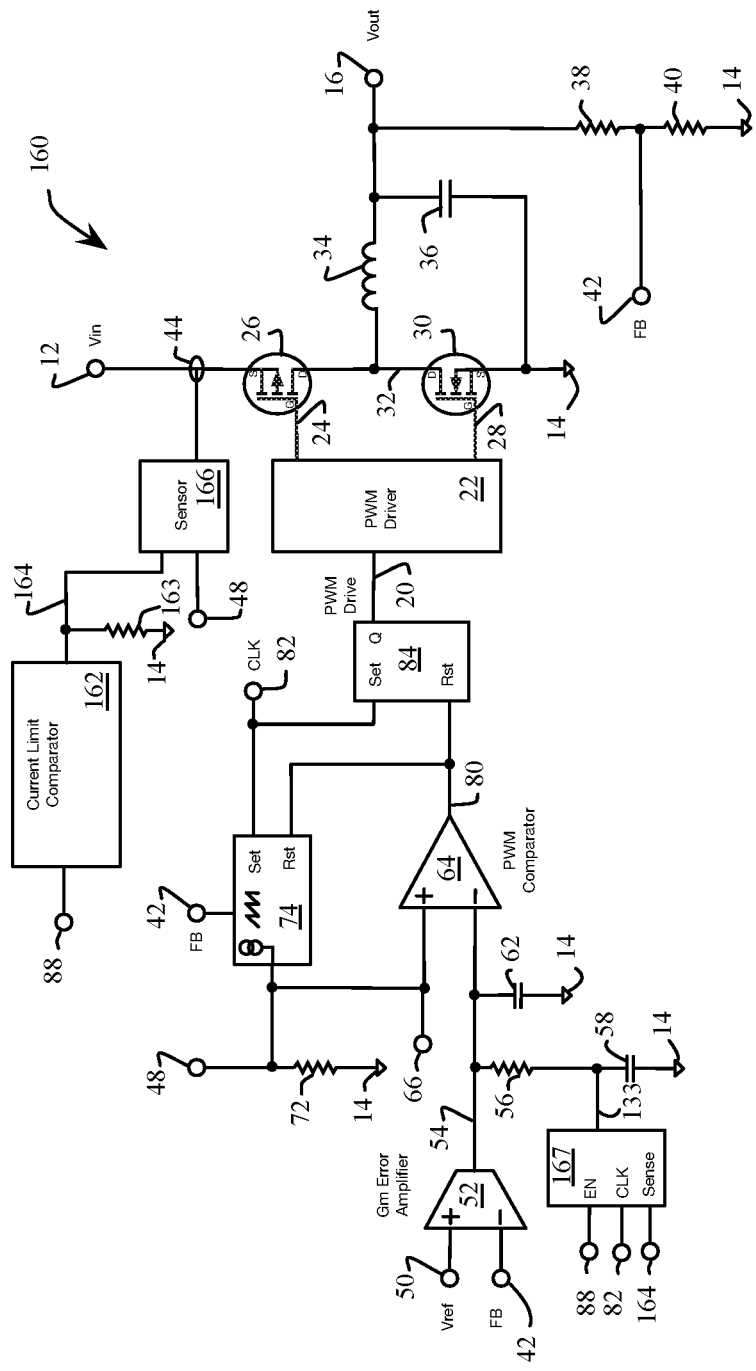
FIG. 6 is a schematic view of a PWM converter with a preset circuit for recovering from a current limit fault, in accordance with an example embodiment of the present disclosure.

FIG. 6 shows an example embodiment 160 configured to respond to a current limit condition of the PWM converter. A current limit comparator 162 compares a voltage generated by a mirrored sensed current flowing through a sense resistor 163 at a mirrored sensed current output 164, with a threshold value (not shown). The current limit comparator 162 thereby determines an enable signal 88 when the mirrored sensed rises above the threshold value, wherein the enable signal 88 enables a sampling circuit 167 used to sample the voltage at the mirrored sensed current output 164. A current sensor 166 generates the mirrored sensed current at the mirrored sensed current output, mirrored from the sensed current 68, provided at the sensed current output 48.

Figure 7:
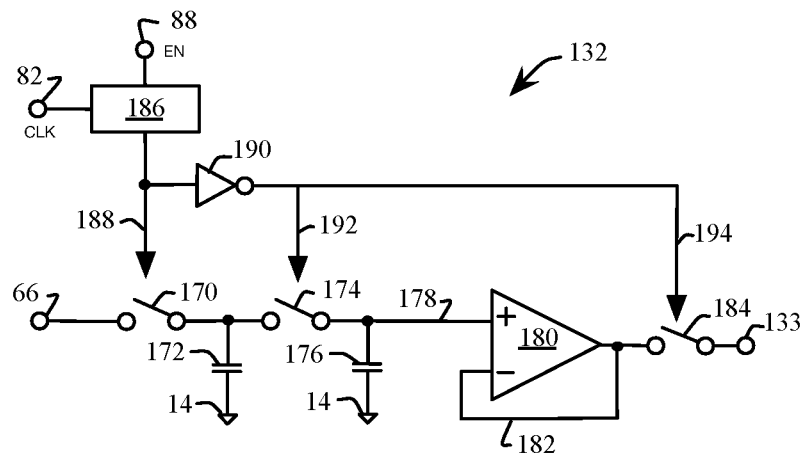
FIG. 7 is a schematic view of a sampling circuit in accordance with an example embodiment of the present disclosure.

FIG. 7 shows an example embodiment of the sampling circuit 132, used within the preset circuit 86 of FIG. 1, FIG. 4, and FIG. 5. The sampling circuit 167 of FIG. 6 is the same as the sampling circuit 132 with the exception of the sense input 164 of circuit 167 replacing the sense input 66 of the circuit 132. The sampling circuit 132 includes a first switch 170 to sample the ramp voltage 66 onto a first capacitor 172, a second switch 174 to sample the sampled voltage from the first capacitor 172 onto a second capacitor 176. The sampled voltage on the second capacitor 176 is received at an input 178, and amplified by, an amplifier 180. The amplifier 180 has a low output impedance. The amplifier 180 is configured as a unity gain amplifier with an output 182 fed back to an input of the amplifier 180. The output 182 of the amplifier 180 is transferred to the output 133 by a third switch 184. A logic circuit 186 activates a first switch control 188 in response to the enable signal 88 being active, and upon detection of the end of a clock cycle of the clock 82. The first switch control 88 is inverted by an inverter 190 to form a second switch control 192 and third switch control 194. The first switch control 188, the second switch control 192 and the third switch control 194 activate the first switch 172, the second switch 174 and the third switch 184, respectively. The sampling circuit 132 is also referred to as a "sample and hold" circuit.

Figure 8:
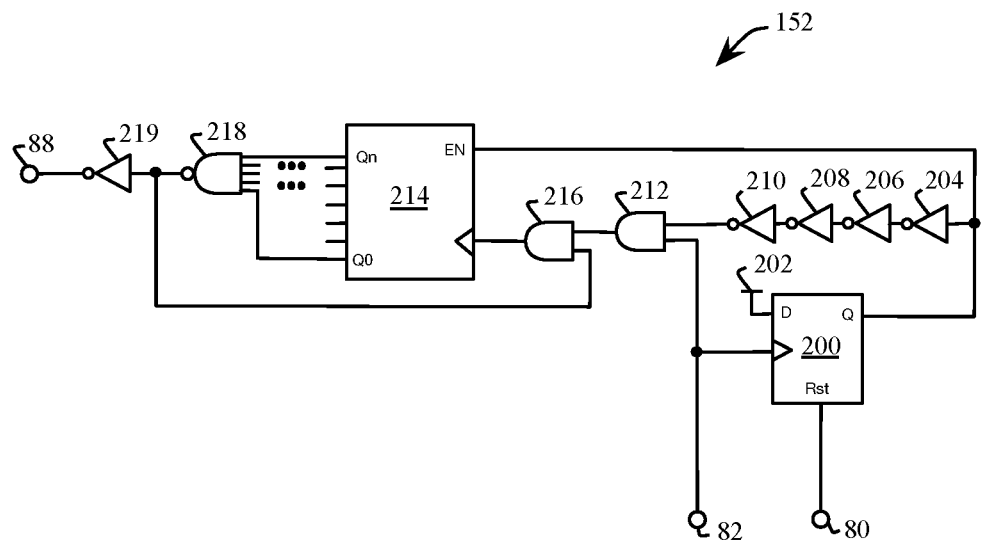
FIG. 8 is a schematic view of a dropout detector in accordance with an example embodiment of the present disclosure.

FIG. 8 shows an example embodiment of the dropout detector 152 of FIG. 5. The dropout detector 152 is reset by the output 80 of the PWM comparator 64 resetting a bistable device 200. During a dropout condition, the output 80 is in a low state, hence the bistable device has exited the reset state. The clock 82 transfers a data input 202 to an output of the bistable device 200. The output of the bistable device 200 is delayed by a serially connected set of inverters 204, 206, 208 and 210 to enable an AND gate 212, aligned to a high level of the clock 82, and to enable a counter 214. Each transition of the clock 82, will cause a rising edge transition on the output of the AND gate 212. A rising edge transition on the output of the AND gate 212 will similarly cause a rising edge transition on the output of an AND gate 216, thereby advancing a count of the counter 214. When the counter 214 has reached the desired value corresponding to a predetermined time period or delay, a NAND gate 218 will active the enable signal 88 through an inverter 219, and disable the AND gate 216 from advancing the count of the counter 214. It should be appreciated that other example embodiments of the sampling circuit 132 and dropout detector 152 are useable with the invention disclosed herein.

Figure 9:
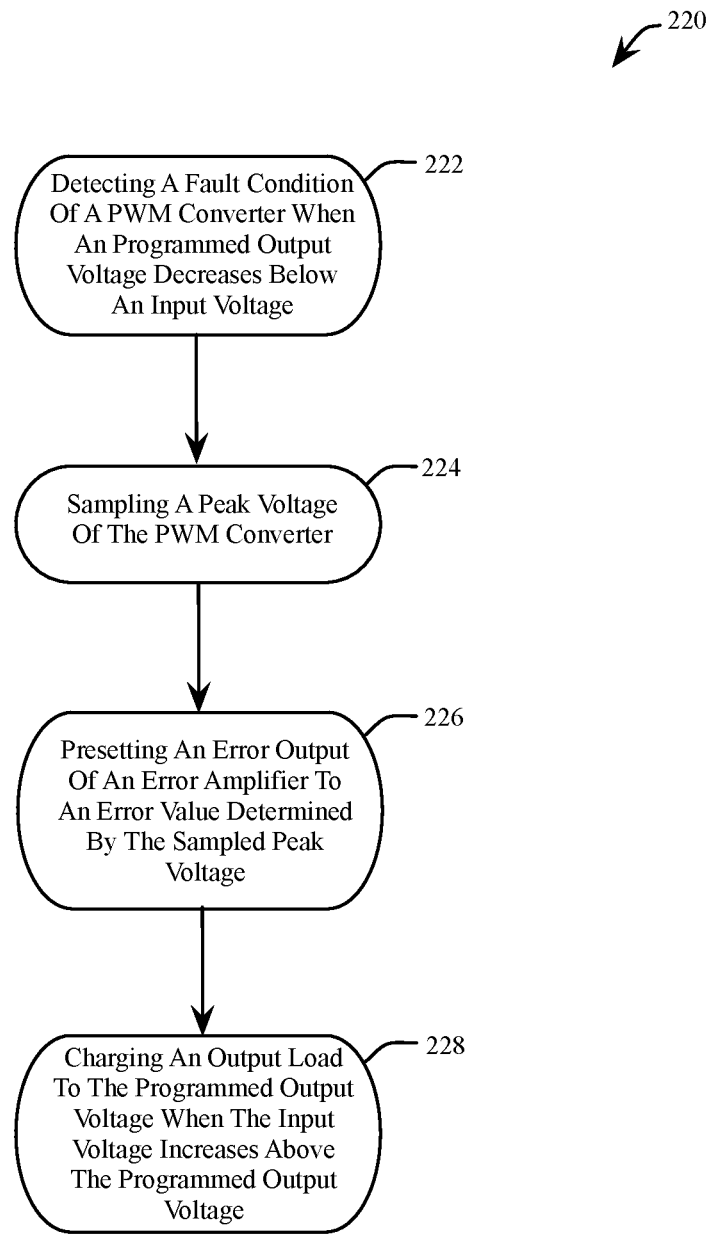
FIG. 9 is a flowchart representation of a method for dynamic enhancement of loop response upon recovery from fault conditions in accordance with an example embodiment of the present disclosure.

FIG. 9 shows an example embodiment 220 of a method for dynamic enhancement of loop response upon recover from fault conditions. At 222, a fault condition of a PWM converter is detected when a programmed output voltage decreases below an input voltage of the PWM converter. At 224, a peak voltage 120 of the PWM converter is sampled. At 226, an error output 54 of an error amplifier 52 is preset to an error value determined by the sampled peak voltage. At 228, an output load (34 and 36) is charged to the programmed output voltage when the input voltage increases above the programmed output voltage.

As will be appreciated, embodiments as disclosed include at least the following. In one embodiment, a method for dynamic enhancement of loop response upon recovery from fault conditions comprises detecting a fault condition in response to a programmed output voltage of a PWM converter decreasing below an input voltage of the PWM converter. A peak voltage is sampled at the end of at least one of a plurality of clock cycles of the PWM converter in response to detecting the fault condition, wherein the peak voltage is proportional to a sensed current conducted through a transistor. An error output of an error amplifier is preset to an error value determined by the peak voltage. A PWM driver is controlled with the error value to drive the transistor. An output load is charged to the programmed output voltage with the transistor in response to the input voltage increasing above the programmed output voltage.

In another embodiment, an apparatus comprises a fault detector configured to detect a fault condition in response to a programmed output voltage of a PWM converter falling below an input voltage of the PWM converter. A sampling circuit is connected to a fault detector output of the fault detector configured to enable the sampling circuit in response to the fault condition. The sampling circuit is coupled to a current sense output of a current sensor configured to sense a sensed current conducted through a transistor, wherein the sampling circuit samples a peak voltage at the end of at least one of a plurality of clock cycles of the PWM converter, and the peak voltage is proportional to the sensed current. An offset circuit is connected between a sampling output of the sampling circuit and an error output of an error amplifier, wherein the offset circuit is configured to preset the error output to an error value determined by the peak voltage. A PWM driver is configured to drive the transistor in response to the error value, and the transistor is configured to charge an output load to the programmed output voltage in response to the input voltage increasing above the programmed output voltage.

In another embodiment, an apparatus comprises a fault detector configured to detect a fault condition of a PWM converter. A sampling circuit is connected to a fault detector output of the fault detector configured to enable the sampling circuit in response to the fault condition. The sampling circuit is coupled to a current sense output of a current sensor configured to sense a sensed current conducted through a high-side transistor, wherein the sampling circuit samples a peak voltage. An offset resistor is connected between a sampling output of the sampling circuit and a terminal of a compensation capacitor. A compensation resistor is connected between the terminal and an error output of an error amplifier, wherein the error output is preset to an error value determined by a peak voltage proportional to the sensed current and a voltage offset is formed across the offset resistor and the compensation resistor. A PWM driver is configured to drive the high-side transistor in response to the error value, and the high-side transistor is configured to charge an output load to the programmed output voltage in response to the input voltage increasing above the programmed output voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for dynamic enhancement of loop response upon recovery from fault conditions comprising:
   detecting a fault condition in response to an input voltage of a Pulse Width Modulation (PWM) converter decreasing below a programmed output voltage of the PWM converter;
   sampling a peak voltage at the end of at least one of a plurality of clock cycles of the PWM converter in response to detecting the fault condition, wherein the peak voltage is proportional to a sensed current conducted through a transistor;
   presetting an error output of an error amplifier to an error value determined by the peak voltage, controlling a PWM driver with the error value to drive the transistor; and
   charging an output load to the programmed output voltage with the transistor in response to the input voltage increasing above the programmed output voltage.

2. The method of claim 1 wherein the peak voltage is increased by a compensation ramp voltage when the fault condition is a dropout condition.

3. The method of claim 1 wherein the fault condition is a dropout condition detected by an inactivity of the PWM driver for a predetermined number of the plurality of clock cycles.

4. The method of claim 1 further comprising detecting, as an additional fault condition, a current limit condition by comparing the sensed current with a current limit value.

5. The method of claim 1 wherein the peak voltage is determined for each of the clock cycles.

6. The method of claim 1 wherein determining the error value comprises driving the peak voltage on a terminal of an offset resistor to increase the error value by a voltage offset determined by the offset resistor and a compensation resistor, wherein the offset resistor is connected in series with the compensation resistor and the compensation resistor is connected to the error output.

7. The method of claim 6 wherein the voltage offset is greater than an input referred offset of a PWM comparator configured to receive the error output of the error amplifier.

8. The method of claim 1 wherein the transistor is a high-side transistor connected between the input voltage and the output load.

9. An apparatus comprising:
   a fault detector configured to detect a fault condition in response to an input voltage of a Pulse Width Modulation (PWM) converter falling below a programmed output voltage of the PWM converter;
   a sampling circuit connected to a fault detector output of the fault detector configured to enable the sampling circuit in response to the fault condition, the sampling circuit coupled to a current sense output of a current sensor configured to sense a sensed current conducted through a transistor, wherein the sampling circuit samples a peak voltage at the end of at least one of a plurality of clock cycles of the PWM converter, and the peak voltage is proportional to the sensed current; and
   an offset circuit connected between a sampling output of the sampling circuit and an error output of an error amplifier, wherein the offset circuit is configured to preset the error output to an error value determined by the peak voltage, a PWM driver configured to drive the transistor in response to the error value, and the transistor configured to charge an output load to the programmed output voltage in response to the input voltage increasing above the programmed output voltage.

10. The apparatus of claim 9 further comprising a ramp output of a ramp generator connected to the current sense output when the fault condition is a dropout condition.

11. The apparatus of claim 9 wherein the fault detector comprises a dropout detector configured to be reset in response to a change in the PWM driver, and to indicate the fault condition on the fault detector output in response to a predefined number of the plurality of clock cycles elapsing without the fault detector being reset.

12. The apparatus of claim 9 wherein the fault detector comprises a dropout detector configured to indicate the fault condition on the fault detector output in response to an input of the error amplifier decreasing below a threshold value.

13. The apparatus of claim 9 wherein the fault detector is further configured to detect a current fault condition in response to the current sense output increasing above a threshold value.

14. The apparatus of claim 9 wherein the offset circuit comprises an offset resistor connected in series with a compensation resistor, and the compensation resistor connected to the error output.

15. The apparatus of claim 9 wherein offset resistor and the compensation resistor form a voltage offset, and the error value equals the peak voltage plus the voltage offset.

16. The apparatus of claim 15 wherein the voltage offset is greater than an input referred offset of a PWM comparator configured to receive the error output of the error amplifier.

17. A method for dynamic enhancement of loop response upon recovery from fault conditions comprising:
   detecting a fault condition in response to a feedback voltage input of a Pulse Width Modulation (PWM) converter decreasing below a programmed output voltage of the PWM converter;
   sampling a peak voltage at the end of at least one of a plurality of clock cycles of the PWM converter in response to detecting the fault condition, wherein the peak voltage is proportional to a sensed current conducted through a transistor;
   presetting an error output of an error amplifier to an error value determined by the peak voltage, controlling a PWM driver with the error value to drive the transistor; and
   charging an output load to the programmed output voltage with the transistor in response to the input voltage increasing above the programmed output voltage.

18. The method of claim 17, wherein the feedback voltage input of the Pulse PWM converter is proportional to an output voltage across the output load.

19. An apparatus comprising:
   a fault detector configured to detect a fault condition in response to a feedback voltage input of a Pulse Width Modulation (PWM) converter falling below a programmed output voltage of the PWM converter;
   a sampling circuit connected to a fault detector output of the fault detector configured to enable the sampling circuit in response to the fault condition, the sampling circuit coupled to a current sense output of a current sensor configured to sense a sensed current conducted through a transistor, wherein the sampling circuit samples a peak voltage at the end of at least one of a plurality of clock cycles of the PWM converter, and the peak voltage is proportional to the sensed current; and an offset circuit connected between a sampling output of the sampling circuit and an error output of an error amplifier, wherein the offset circuit is configured to preset the error output to an error value determined by the peak voltage, a PWM driver configured to drive the transistor in response to the error value, and the transistor configured to charge an output load to the programmed output voltage in response to the input voltage increasing above the programmed output voltage.

20. The apparatus of claim 19, wherein the feedback voltage input of the Pulse PWM converter is proportional to an output voltage across the output load.

21. A method for dynamic enhancement of loop response upon recovery from fault conditions comprising:
   detecting a current limit fault condition by comparing a sensed current conducted through a transistor with a current limit value;
   sampling a peak voltage at the end of at least one of a plurality of clock cycles of the PWM converter in response to detecting the current limit fault condition, wherein the peak voltage is proportional to the sensed current conducted through the transistor;
   presetting an error output of an error amplifier to an error value determined by the peak voltage, controlling a PWM driver with the error value to drive the transistor; and
   charging an output load to the programmed output voltage with the transistor in response to the input voltage increasing above the programmed output voltage.

22. An apparatus comprising:
   a fault detector configured to detect a current limit fault condition by comparing a sensed current conducted through a transistor with a current limit value;
   a sampling circuit connected to a fault detector output of the fault detector configured to enable the sampling circuit in response to the fault condition, the sampling circuit coupled to the current sense output of a current sensor configured to sense the sensed current conducted through the transistor, wherein the sampling circuit samples a peak voltage at the end of at least one of a plurality of clock cycles of the PWM converter, and the peak voltage is proportional to the sensed current; and
   an offset circuit connected between a sampling output of the sampling circuit and an error output of an error amplifier, wherein the offset circuit is configured to preset the error output to an error value determined by the peak voltage, a PWM driver configured to drive the transistor in response to the error value, and the transistor configured to charge an output load to the programmed output voltage in response to the input voltage increasing above the programmed output voltage.

* * * * *